United States Patent [19]
Tanabe

[11] Patent Number: 5,329,418
[45] Date of Patent: Jul. 12, 1994

[54] 3-D COMMUNICATION AND INTERCONNECT TECHNIQUE FOR INCREASED NUMBER OF COMPUTATIONAL MODULES IN LARGE-SCALE ELECTRONIC EQUIPMENT

[75] Inventor: Notoru Tanabe, Yokohama, Japan

[73] Assignee: Kabushiki Kaisha Toshiba, Kawasaki, Japan

[21] Appl. No.: 978,505

[22] Filed: Nov. 18, 1992

[30] Foreign Application Priority Data

Nov. 18, 1991 [JP] Japan .................................. 3-301475

[51] Int. Cl.$^5$ ........................................... H05H 7/20
[52] U.S. Cl. ................................ 361/695; 361/735; 361/790
[58] Field of Search .............................. 361/383–385, 361/391–396, 399

[56] References Cited

U.S. PATENT DOCUMENTS 3,467,892  9/1969  Sprude et al. ..................... 361/384
4,401,351  8/1983  Record ............................. 361/395

OTHER PUBLICATIONS

The MIT Report, vol. XIX, No. 5, Ward, pp. 1, 5, Jun. 1991, "Numesh: Innovation in Computer Design."

Primary Examiner—Gregory D. Thompson
Attorney, Agent, or Firm—Oblon, Spivak, McClelland, Maier & Neustadt

[57] ABSTRACT

A circuit board packaging structure includes an array of rectangular pipe-shaped circuit modules with rows and columns. Each of the circuit modules has two opposite openings, inner wall surfaces which permit electric circuit components to be mounted thereon and have wiring patterns for electrical interconnection among the circuit components, and outer wall surfaces. Intermodule connectors are provided on the outer wall surfaces of the pipe-shaped circuit modules to permit electrical interconnection between each of the circuit modules and its associated circuit module. A cooling medium is forced to flow through each of the circuit modules in one direction, thereby directly or indirectly cooling the electric circuit components such as semiconductor integrated circuit devices mounted on the inner wall surfaces of the circuit modules.

17 Claims, 14 Drawing Sheets

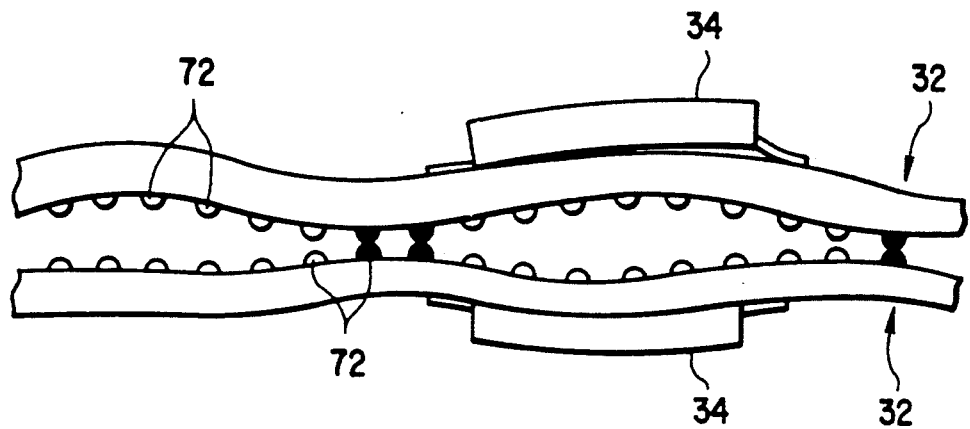
F I G. 4
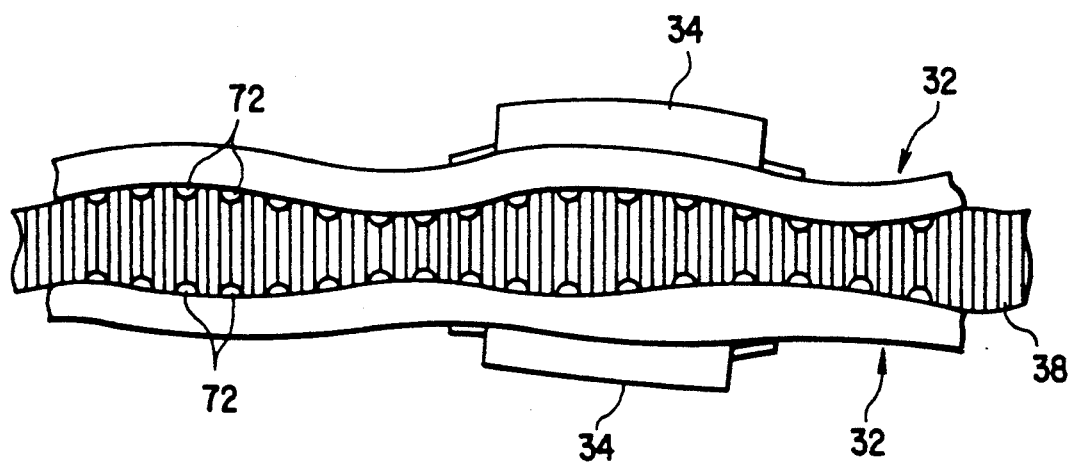
F I G. 5

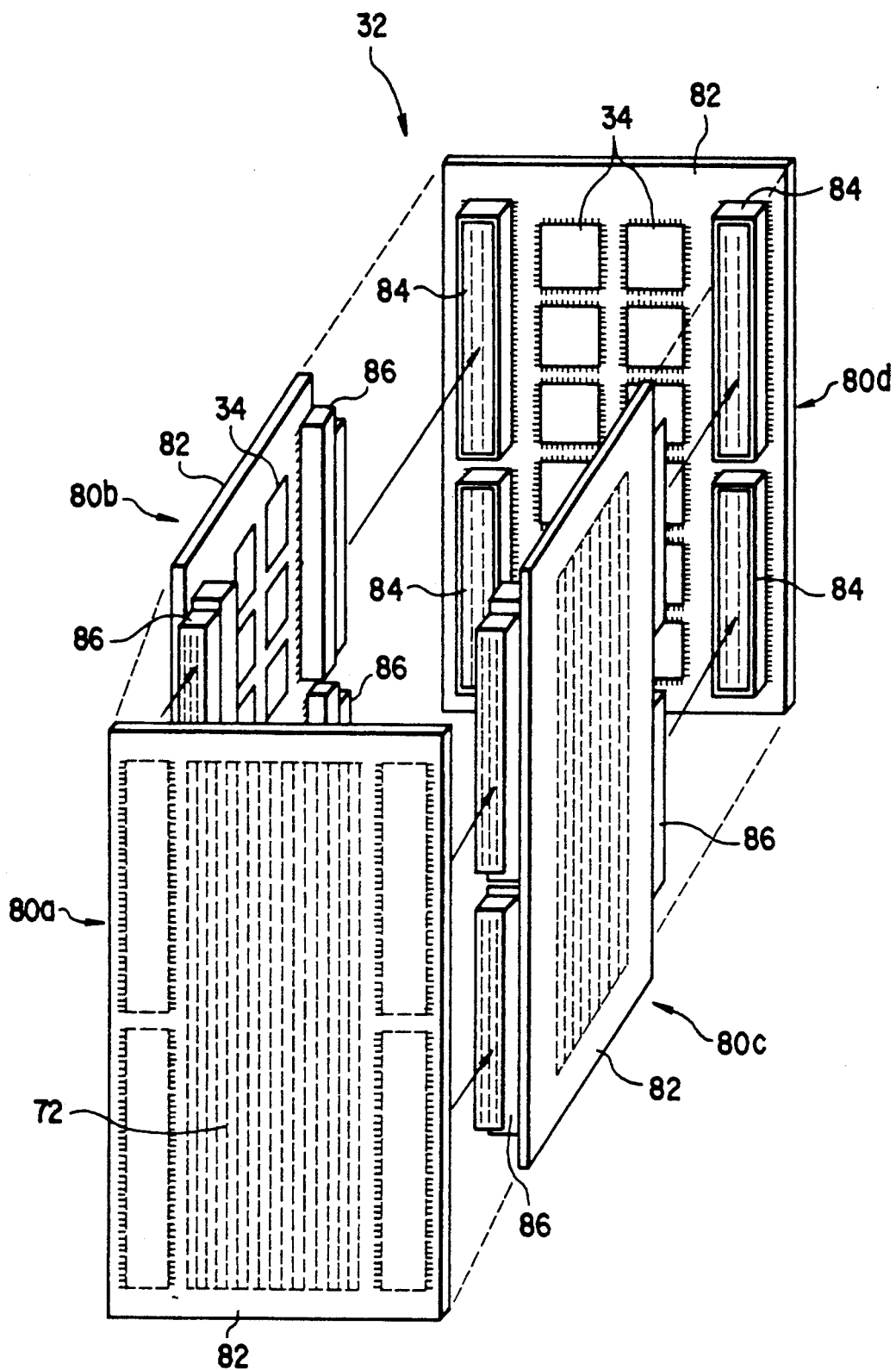
F I G. 6

3-D COMMUNICATION AND INTERCONNECT TECHNIQUE FOR INCREASED NUMBER OF COMPUTATIONAL MODULES IN LARGE-SCALE ELECTRONIC EQUIPMENT

BACKGROUND OF THE INVENTION

1. Field of the Invention

The present invention relates to techniques of packaging electric circuit boards and, more specifically, to circuit board packaging hardware structures for packaging at high density into a full system an interconnected set of an increased number of computational modules using printed wiring circuit boards for large-scale, highly-advanced electronic digital equipment such as supercomputers adapted for massively parallel processing.

2. Description of the Related Art

With recent improvements in the performance and reliability of highly advanced electronic equipment such as massively parallel computers, the scale of electronic circuits used is becoming increasingly large. This will involve an increase in the number of circuit components. Although the integration density of semiconductor integrated-circuit (IC) devices is increasing and the capability of packing electronic circuits into an IC chip is also increasing, the enlargement of circuit scale exceeds the packing capability. In order to decrease the number of printed wiring boards used in electronic equipment as far as possible, a multilayer interconnection technique is applied to each board. The application of the multilayer interconnection technique increases the packaging density of semiconductor IC devices on each board, thus achieving an increased total packaging efficiency of electronic equipment.

However, the recent advances of technology impose unlimited requirements on further improvements in the existing high-density packaging technique. With the existing high-density packaging technique, it is a common practice to arrange a number of separate printed wiring boards in plane. For interconnection between adjacent ones of these boards, a connecting method called "back plane" or flexible flat connecting cables are used. The back-plane connection method is a technique of implementing interconnection of ordinary printed wiring boards each having a large number of IC devices mounted thereon.

Typically, a main board (mother board) having connector members, called "card edge connectors", attached to its peripheral edges is used. A printed wiring board is plugged, at its end whereat a connection pad train pattern is arranged, into the mother board, thereby obtaining electrical interconnection therebetween. The back-plane connection method, which eliminates the need of wiring connecting members between boards, can achieve a fairly high packaging density; however, the boards will require extra areas to form pad patterns for interconnection only at their corresponding peripheries. With the recent advance of high-density packaging, technology connection terminals required with boards have been increasing in number. An increase in the number of connection terminals results in an increase in the number of pads in a pad pattern of each board, which will undesirably increase the extra board area.

Naturally, manufacturing constraints are imposed on the size of printed wiring boards. If the extra board area for interconnection of printed wiring circuit boards were increased and no matter how internal electronic circuits were packed into a semiconductor IC chip successfully with a high density, an increase in the area of a resulting board would limit the efficiency in packaging a large number of boards in a full frame to a low level. This is a serious obstacle to the implementation of final high-density packaging of large-scale electronic equipment which system manufacturers have long desired.

SUMMARY OF THE INVENTION

It is therefore an object of the present invention to provide a new and improved technique of packaging printed wiring boards with a high density.

It is another object of the present invention to provide a new and improved hardware structure adapted for packaging circuit boards which permits maximization of the packaging density, in a full system, of an interconnected set of an increased number of computational modules containing circuit wiring boards for large-scale highly-advanced electronic equipment such as massively parallel computers.

In accordance with the above objects, the present invention is directed to a specific circuit board packaging hardware structure which comprises a plurality of pipe-shaped circuit modules each having two opposite first and second openings, an inner surface which permits electric circuit components to be mounted thereon and has wiring patterns for electrical interconnection among them, and an outer surface. Intermodule connectors are provided on the outer surfaces of the circuit modules to permit electrical interconnection between each of the circuit modules and a corresponding one of the circuit modules which is to be associated with it.

The foregoing and other objects, features and advantages of the invention will become apparent from the following more particular description of preferred embodiments of the invention, as illustrated in the accompanying drawings.

BRIEF DESCRIPTION OF THE DRAWINGS

FIGS. 4 and 5 are fragmentary sectional views of combined rectangular pipe-shaped circuit modules illustrating hard conductive bumps provided as contact terminals on those outer walls of two adjacent ones of the rectangular pipe-shaped circuit modules of FIG. 1 which are joined together.

FIG. 6 is a perspective view illustrating how four printed wiring boards are assembled into a rectangular pipe-shaped circuit module shown in FIG. 1.

DETAILED DESCRIPTION OF THE PREFERRED EMBODIMENTS

Figure 1:
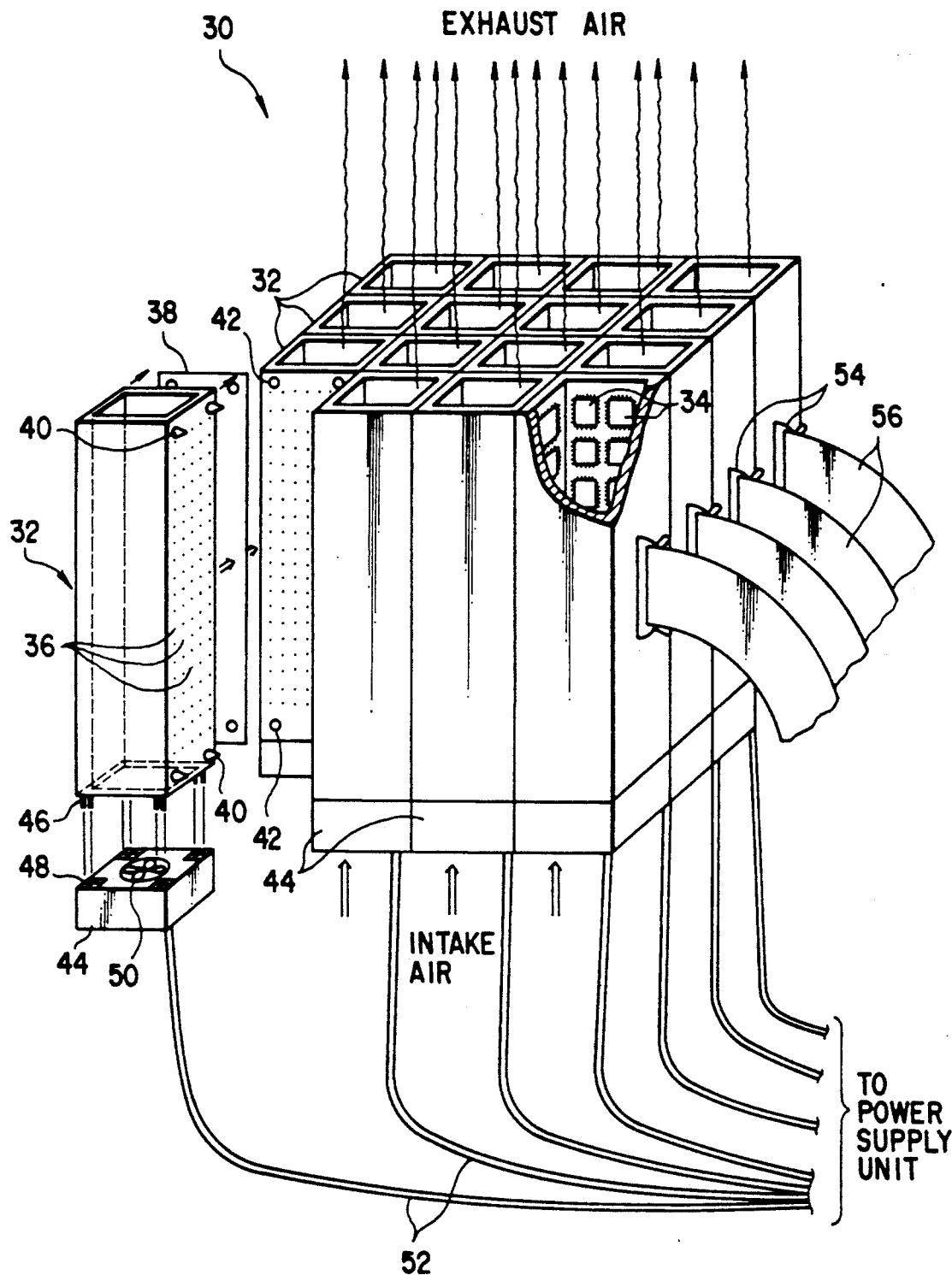
FIG. 1 is a schematic illustration of the entire configuration of a circuit board packaging hardware structure in accordance with a preferred embodiment of the present invention.

Referring now to FIG. 1, a circuit board packaging hardware structure adapted for massively parallel computers according to a preferred embodiment of the present invention is generally designated by the numeral 30. The structure includes a plurality of pipe-shaped circuit modules 32. Each of the circuit modules 32 is a hollow rectangular straightened pillar having openings at its opposed ends. In FIG. 1, sixteen circuit modules 32 are illustrated for convenience of illustration only, which are joined to their neighbors at their outer walls to construct an array of circuit modules with four rows and four columns.

The inner walls of each of the rectangular pipe-shaped circuit modules 32 are utilized to mount various types of circuit components or elements 34. Typically, the circuit components 34 may include semiconductor large-scale integrated-circuit devices (LSIs), semiconductor integrated-circuit devices (ICs), transistors, capacitors, inductors, resistors, diodes, switching devices, and so on. A rectangular pipe-shaped circuit module 32 disposed at a certain corner of the structure 30 is illustrated with its portion broken away to reveal LSI devices mounted on its inner walls. The circuit components packaged in the pipe-shaped circuit modules 32 are interconnected by wiring patterns formed on their inner wall surfaces or on inner wiring layers of the wall.

An outer wall of each of the rectangular pipe-shaped circuit modules 32 is provided with a large number of contacts 36 for electrical connection. These contacts 36 are electrically coupled to selected ones of the wiring patterns on the inner wall of the circuit module 32 by means of, for example, known conductive through-holes. Circuit components 34 packaged in adjacent circuit modules which are joined at their outer walls are therefore made electrically communicative by connecting corresponding contacts on the outer walls. In order to attain electrical connection between corresponding contacts on the outer walls, an anisotropic conductive sheet 38 is sandwiched between adjacent circuit modules. Protruding portions 40 and corresponding recessed portions 42, which are provided in selected positions of the outer walls of the circuit modules, serve as positioning members for facilitating mechanical coupling between the modules. The positioning of the pipe-shaped circuit modules 32 in coupling them will be facilitated by fitting the protruding portions 40 into the recessed portions 42.

As shown in FIG. 1, a cooling fan unit 44 is attached to the lower opening end of each of the pipe-shaped circuit modules 32. The connection between the circuit module 32 and the cooling fan unit 44 is made by fitting four protrusions 46 provided at the four corners of the rectangular open end of the circuit module into corresponding recesses 48 at the four corners of the top surface of the cooling fan unit. The cooling fan unit 44 includes a fan 50 driven by an electric motor (not shown). Power-supply cables to the fan motors of the cooling fan units 44 are bundled together for connection to a power supply unit. When the cooling fans 50 are driven, cooling air flows within the rectangular pipe-shaped circuit modules 32 from their lower openings to their upper openings, thereby permitting forced air-cooling of the circuit components 34 packaged in the circuit modules.

The outer wall surfaces, which are flushed with one another, of four linearly arranged circuit modules of the 16 rectangular pipe-shaped circuit modules 32 are provided with connectors 54 to ensure electrical association with external circuitry of a massively parallel computer. Flexible, flat cables 56 are fitted into these connectors 54, thereby permitting signal transmissions between the circuit board packaging hardware structure 30 and the external circuitry.

Figure 2:
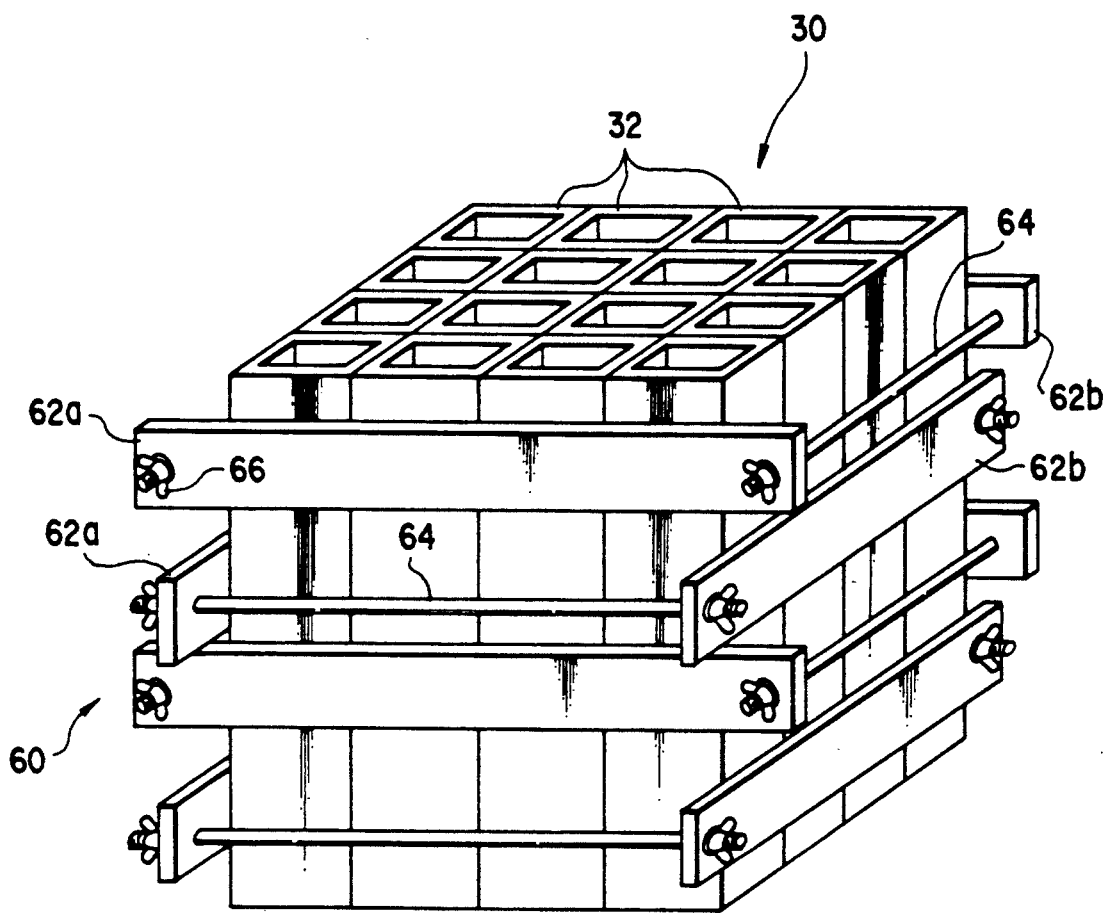
FIG. 2 illustrates a mechanism for clamping a plurality of rectangular pipe-shaped circuit modules for constructing the circuit board packaging hardware structure of FIG. 1.

The pipe-shaped circuit modules 32 shown in FIG. 1 are tied together strongly by means of a pressure clamping mechanism, indicated collectively at 60, as shown in FIG. 2. In FIG. 2, the clamping mechanism 60 includes four pairs of clamping plates 62a and 62b. A pair of clamping plates 62a, 62b, which are pressed upon the opposed outer walls of the circuit board packaging structure 30, are coupled together by means of a pair of clamping bar members 64 (the bars on the opposite side are invisible in the perspective view of FIG. 2). Each of the bars 64 is threaded at its both ends. The threaded portions of each bar are introduced into holes formed at both ends of each clamping plate and then nuts 66 are set, thereby permitting the paired clamping plates 62a, 62b to clamp the rectangular pipe-shaped circuit modules 32 strongly. In this way, the four pairs of clamping plates clamp the circuit board packaging structure 30 at alternate places on its outer wall surfaces as shown in FIG. 2.

Figure 3:
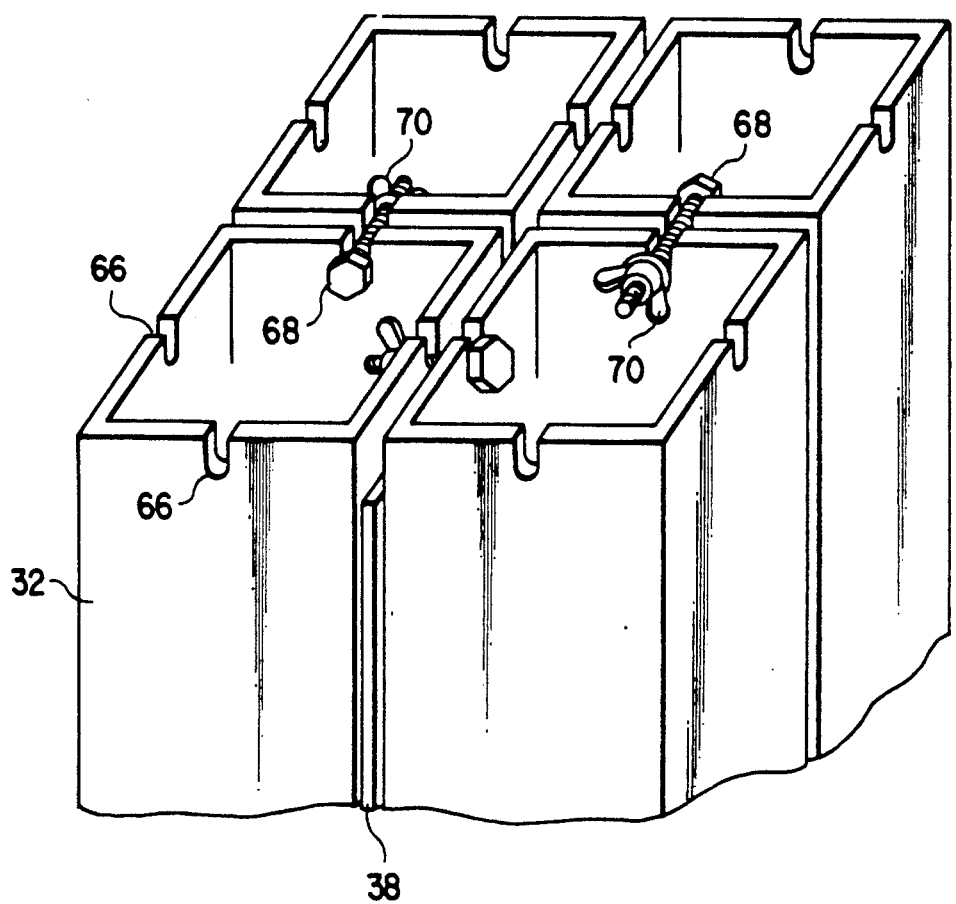
FIG. 3 is an enlarged view of a circuit board packaging hardware structure which specifically illustrates a modification of the clamping of the pipe-shaped circuit modules of FIG. 2.

The clamping mechanism of FIG. 2 may be modified as shown in FIG. 3 wherein, of the 16 rectangular pipe-shaped circuit modules 32, only four neighbors are illustrated enlarged for the purpose of illustration only. Four half slits 66 are formed at the opening end of each of the pipe-shaped circuit modules 32. A bolt 68 and a butterfly nut 70 are introduced into the half slits 66, facing each other, of two adjacent pipe-shaped circuit modules 32. By setting the nut 70 the circuit modules 32 are clamped together.

As shown in FIG. 4, the contact terminals 36 arranged on the straight outer wall surface of each pipe-shaped circuit module 32 of FIG. 1 are made of hard conductive bumps 72 of a semi-spherical shape. The illustration of FIG. 2 is deformed to visually emphasize "planar distortion" of the outer wall surfaces of adjacent pipe-shaped circuit modules. The outer surfaces of adjacent pipe-shaped circuit modules may actually be poor in flatness and may even become wavy. In such a case, the bumps indicated in black in FIG. 4 can provide electrical contacts but the others provide electrical contacts. Under this situation, good electrical connection between the pipe-shaped circuit modules can no longer be expected. In order to prevent such defective electrical connection from occurring, the anisotropic conductive sheet 38 shown in FIG. 1 is inserted between the outer walls of adjacent pipe-shaped circuit modules 32 as shown in FIG. 5. In the illustration of FIG. 5, vertical hatching is made so as to visually emphasize such a unidirectional conductivity characteristic of the anisotropic conductive sheet as exhibits conductivity in the direction in which pressure is applied and insulation in other directions.

As shown in FIG. 6, each pipe-shaped circuit module 32 may be constructed by four multi-layer printed wiring boards 80a, 80b, 80c, 80d of a rectangular shape. Each of the printed wiring boards 80 has a substrate 82 made of an insulating material such as glass epoxy material. The rigid insulating substrate 82 has a top surface (an inner surface of the rectangular pipe-shaped circuit module 32) on which the above-mentioned semiconductor integrated-circuit chips 34 such as LSIs are mounted. On that face is arranged a printed wiring pattern for electrical connections among those LSIs. On the rear of the substrate are formed the above-mentioned contacts 36.

The four printed wiring boards 80 are assembled as shown in FIG. 6, thereby constructing a rectangular pipe-shaped circuit module. Each of the front and rear wiring boards 80a, 80d, facing each other, is equipped with multi-terminal female connectors 84 arranged in two rows along their opposing long sides. Each of the other wiring boards 80b, 80c facing each other in the left-to-right direction is equipped with male connectors 86 corresponding to the female connectors 84. Plugging the male connectors 84 on the left and right wiring boards 80b, 80c into the corresponding female connectors 84 on the front and rear wiring boards 80a, 80d permits one pipe-shaped circuit module to be assembled.

Figure 7:
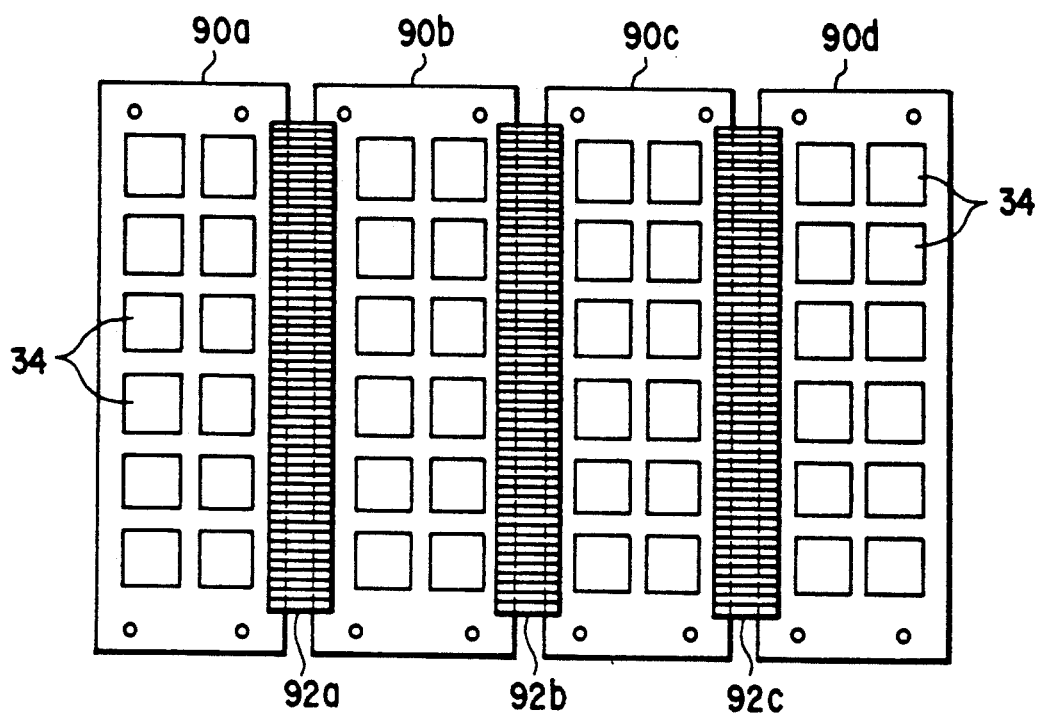
FIG. 7 is a plan view of a modification of four printed wiring boards for constructing a rectangular pipe-shaped circuit module shown in FIG. 1.
Figure 8:
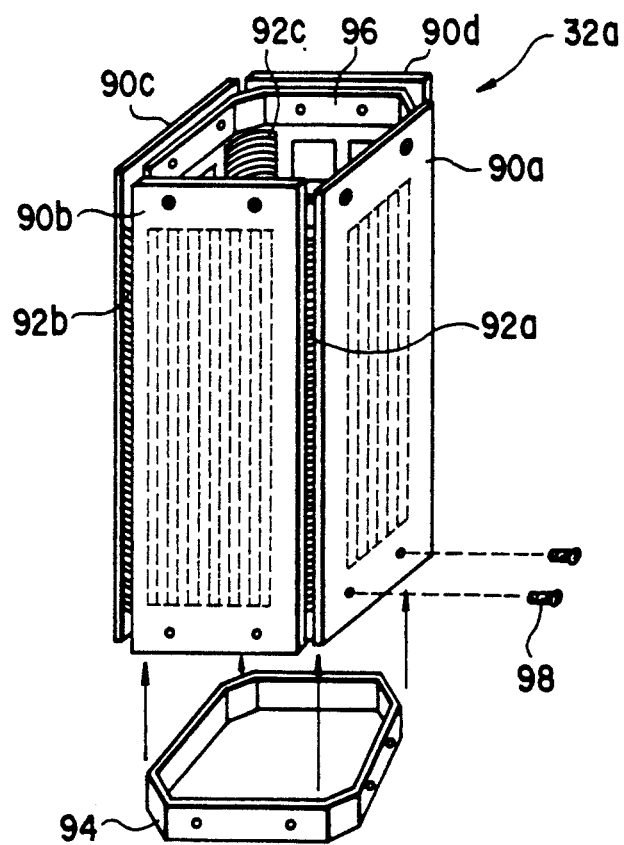
FIG. 8 is a perspective view illustrating how the printed wiring boards of FIG. 7 are assembled into a circuit module.

Each of the rectangular pipe-shaped circuit modules 32 may alternatively be constructed, as shown in FIG. 7, by four multi-layer printed wiring boards 90a, 90b, 90c, 90d of a rectangular shape, which are electrically connected together by three flexible, flat connector substrates 92a, 92b, 92c. Since the flat connector substrates 92 can be bent easily, the multi-layer printed wiring boards 90 can be assembled, as shown in FIG. 8, into a square prism to form one square-pipe-shaped circuit module. Frame members 94, 96 of a square ring shape are placed inside the upper and lower openings of the circuit module 32 and then they are fixed to the circuit boards by means of screws 98.

Figure 9:
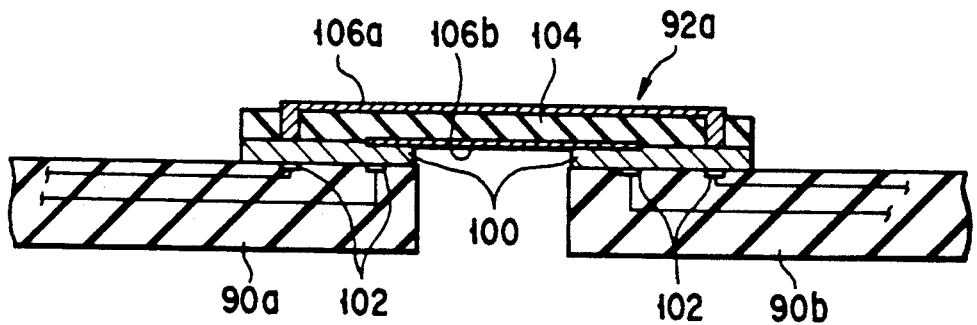
FIGS. 9 and 10 are fragmentary sectional views of two adjacent boards illustrating two possible examples of interconnection of printed wiring boards of FIG. 7.

As shown in FIG. 9, each (92a, for example) of the flexible flat connector substrates 92 of FIG. 7 is connected by two anisotropic conductive films 100 to a plurality of connection pad terminals 102 of two adjacent printed wiring boards 90a, 90b associated with the flexible flat connector 92a. More specifically, the flat connector substrate 92 has an insulating substrate 04 made from resin, for example. The wiring pattern includes wiring pattern portions 106a, 106b which are put on the top and bottom surfaces of the substrate 104. The upper wiring portion 106a emerges from through-holes provided at two opposite ends of the substrate 104 to the rear side of the substrate. The flat connector substrate 92a is placed to extend over opposing ends of two neighboring printed circuit boards 90a, 90b. The anisotropic conductive films 100 are sandwiched between the flat connector substrate 92a and the printed circuit board 90a and between the substrate 92a and the circuit board 90b, respectively, as shown in FIG. 9.

Figure 10:
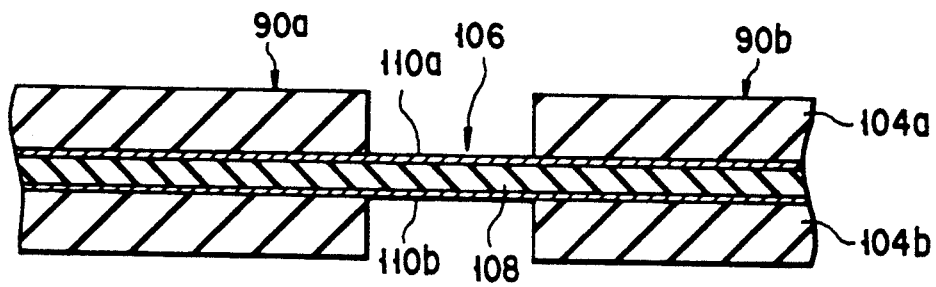

The connection method using the anisotropic conductive films 100 of FIG. 9 may be modified as shown in FIG. 10 wherein each of adjacent printed wiring boards 90 (for example, 90a and 90b) has two rigid upper and lower substrates 104a, 104b stacked to sandwich a flexible wiring pattern layer 106 therebetween. The flexible wiring pattern layer 106 has an insulating base sheet 108 common to the adjacent printed wiring boards 90a, 90b. Wiring pattern layers 110a, 110b are formed on the opposed surfaces of the sheet 108. Such an arrangement will achieve much improved packaging density with connection reliability increased.

A significant feature of the circuit board packaging hardware structure 30 arranged as described above and suited for large-scale electronic equipment is the attainment of high-density packaging. Specifically, with the circuit board packaging structure 30, a plurality of rectangular pipe-shaped circuit modules 32 each having a unidirectional air passage are specifically employed. As was described in connection with FIG. 1, circuit components 34, such as semiconductor integrated-circuit devices, and wiring patterns for interconnection among them are mounted on the closed inner surfaces of each of the pipe-shaped circuit modules 32. Signal transmissions between adjacent pipe-shaped circuit modules 32 are made through contact terminals 36 provided on their straight outer walls. The employment of such a solid (three-dimensional) packaging structure permits an increased number of circuit components to be crammed into minimum packaging space with a high packaging density. Thus, the packaging density can be enhanced to the maximum with packaging efficiency maintained.

Another significant feature of the structure 30 is the attainment of improved cooling efficiency with the size of the whole system kept compact. That is, according to the present embodiment, the closed inner walls of each pipe-shaped circuit module are dedicated to packaging areas for circuit components, and they are directly exposed to a unidirectional air passage, permitting cooling efficiency to be improved. To be specific, the fan unit 44 is attached to the lower opening end of each circuit module, and thus heat, which is accumulated in or generated from circuit components when the system is in operation, is discharged from the upper opening to outside when the fan rotates. Such unidirectional forced air-cooling allows the cooling efficiency to be improved with the size of the entire circuit board packaging structure 30 made compact.

A further significant feature of the present embodiment is that, as typically shown in FIG. 5, the anisotropic conductive sheet member 38 is inserted between the outer walls of adjacent ones of the pipe-shaped circuit modules 32 on which the contact terminals 36 are arranged. The use of the anisotropic conductive sheet 38 permits the reliability of electrical interconnection between adjacent circuit modules, which is achieved by contact at their outer walls, to be improved with the production yield maintained high.

Figure 11:
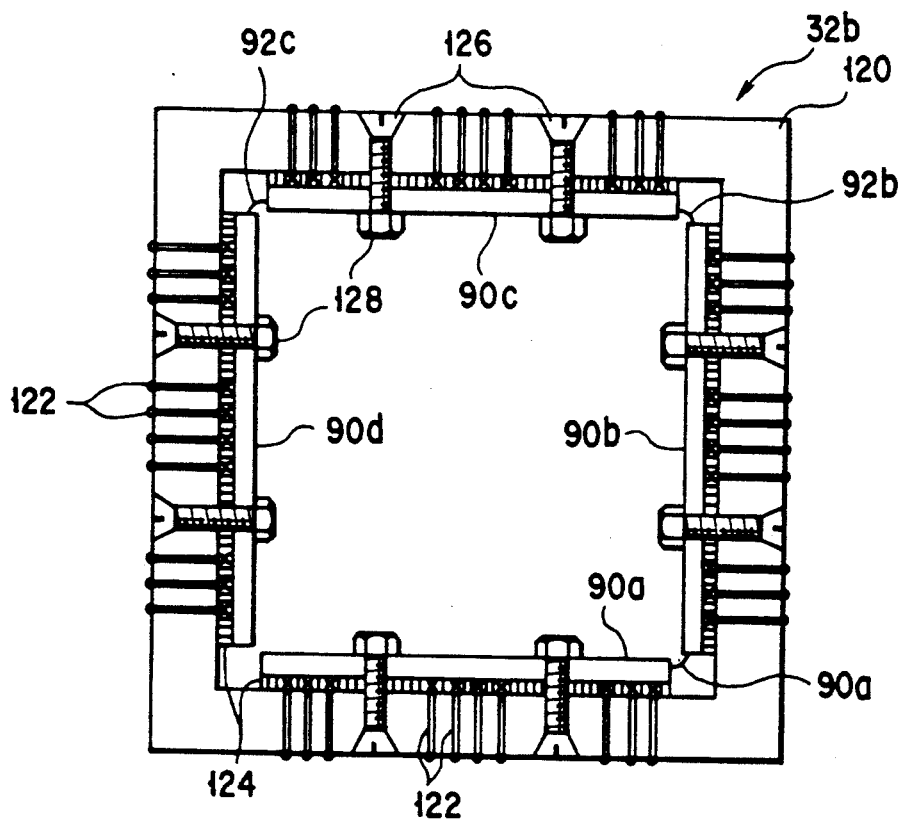
FIGS. 11 and 12 are the top view and a perspective view, respectively, of a modification of the rectangular pipe-shaped circuit module of FIG. 1.

Each of the pipe-shaped circuit modules 32 of FIG. 1 may also be modified as shown in FIG. 11 in place of the configuration shown in FIG. 6 or FIGS. 7 and 8. A rectangular pipe-shaped circuit module 32b is similar to that of FIG. 8 with (1) the printed wiring boards 90a to 90d with the flexible flat connectors 92 of FIG. 8 being mounted on the inner walls of a rigid insulating square pipe 120, and (2) the ring-like fixing members 94, 96 of FIG. 8 being eliminated. The pipe 120 is provided with a large number of conductive through-holes 122 in its four walls. The assembly of the boards 90a to 90d and the flexible connectors 92a to 92c of FIG. 7 is bent at the connectors and then four anisotropic conductive sheets 124 are each placed between the outer wall of a board 90 and an inner wall of the pipe 120 for providing electrical connection therebetween. Mechanical coupling between the board 90 and the pipe 120 is made by screws 126 and nuts 128. With such an arrangement, the boards 90 packaged into each pipe-shaped circuit module 32b can be taken out of the pipe 120 relatively easily after assembly. This leads to an improvement in maintenance of the pipe-shaped circuit modules 32.

Figure 12:
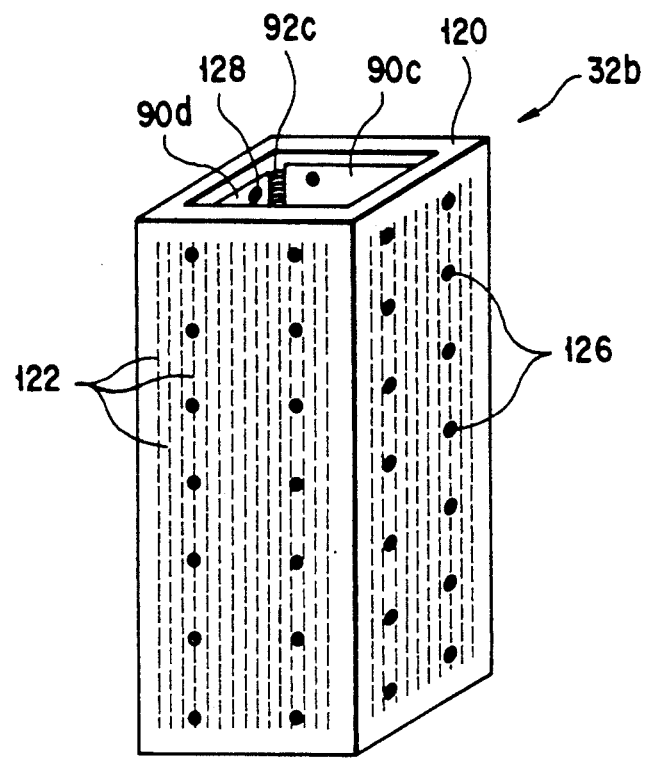

Note here that the boards to be packaged into the square pipe 120, shown in FIGS. 11 and 12, may be replaced with a single bendable printed wiring board having LSIs mounted thereon. Typically, a single board, which is designed such that it can be bent in three places, may be heated locally in the bendable places to cause plastic deformation, thereby obtaining such a pipe-shaped circuit module as shown in FIG. 8. In such a case, while there is a risk that the electrical characteristics of wiring patterns and/or the insulation characteristics of the bent board degrade in the flat parts of the board bent by heat deformation, the manufacturing cost can be reduced and the production yield can be improved considerably.

The circuit board packaging hardware structure 30 of FIG. 1 may alternatively be applied with a forced liquid-cooling to be described below, rather than the forced air-cooling described above. In this case, a cooling liquid (coolant) flow guide unit 130 subjected to elastic deformation by liquid pressure is additionally used with each of the pipe-shaped circuit modules 32 of FIG. 1. The refrigerant flow guide unit 130 includes a guide bag 132 which is low in thermal resistivity and expands freely as indicated by broken lines 134 when pressured by cooling liquid flowing therethrough. Joints 136, 138 are attached to opposing opening ends of the elastic bag 132. The joints 136, 138 have pipe-like necks 140, 142 made of metal and round in section, respectively, which are used to attach a coolant supply pipe (or hose) 146 (see FIG. 14) for feeding pressurized cooling water into the bag 132 and a coolant drain pipe (or hose) 146 for draining the water out of the bag.

Figure 13:
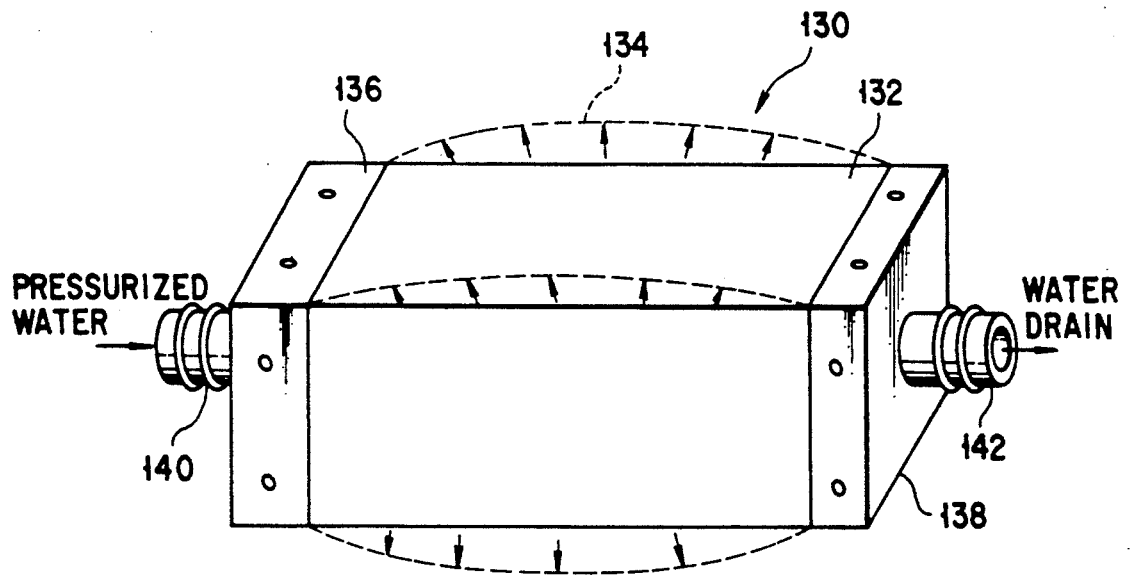
FIG. 13 is a perspective view of a coolant flow guide unit preferably used for liquid cooling of each of the rectangular pipe-shaped circuit modules.
Figure 14:
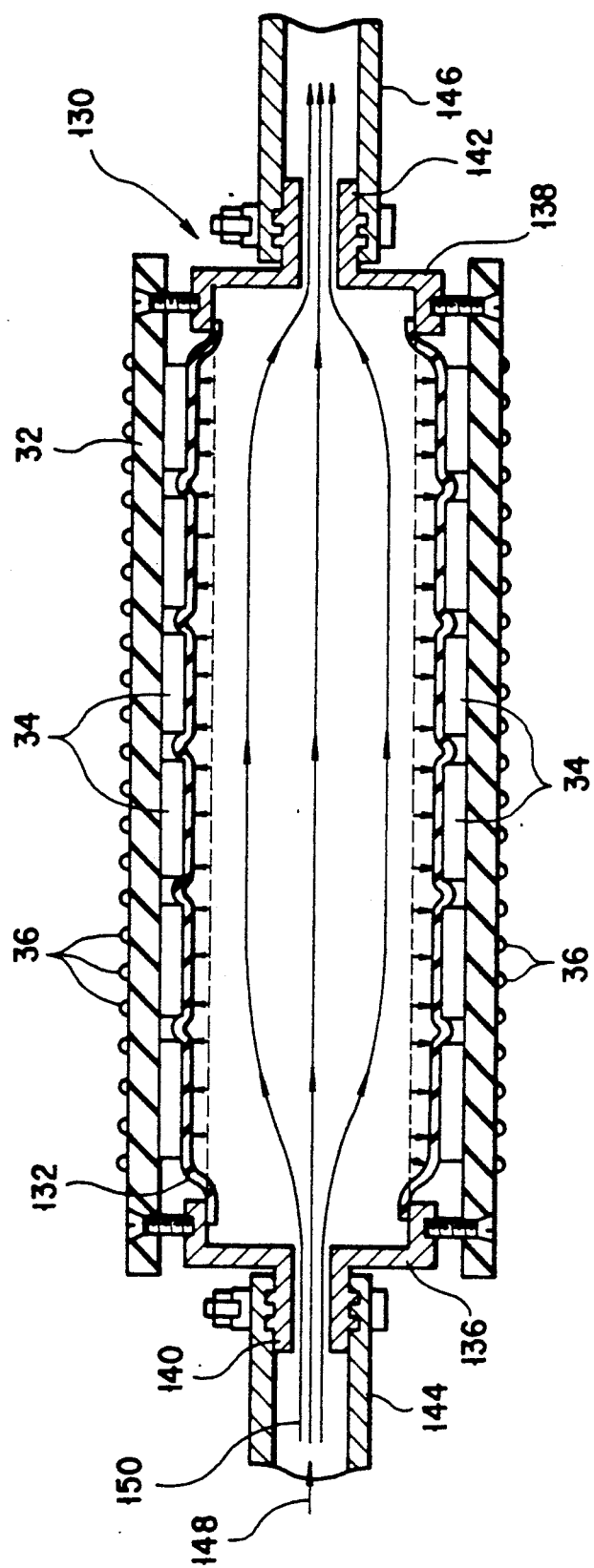
FIG. 14 is a sectional view of a rectangular pipe-shaped circuit module into which the coolant flow guide unit of FIG. 13 is incorporated.

The cooling liquid flow guide unit 130 of FIG. 13 is introduced into the pipe-shaped circuit module 32 and then screwed tightly to the module at the joints 136, 138 as shown in FIG. 14. When supplied with cooling water (typically pressurized cold water) from the coolant supply pipe 144, the elastic bag 132 expands to be brought into contact with the inner wall surfaces of the pipe-shaped circuit module 32 on which the semiconductor integrated circuit devices 34 are mounted, thereby cooling them. The cooling liquid flows through the guide unit 130 as indicated by arrows 150 and is then drained out of the coolant drain pipe 146 to outside. Such an arrangement permits higher cooling efficiency. If specific liquid good in insulation were used as a coolant, the coolant could be made to flow through the pipe-shaped circuit module instead of using the bag 132.

The embodiment using the liquid-cooling system of FIGS. 13 and 14 can exhibit the following unexpected results: The electrical connection between adjacent ones of the pipe-shaped circuit modules 32 being bundled together as shown in FIG. 1, through the contact terminals 36, can be further improved due to the fact that the bag 132, when pressured by the cooling liquid flowing internally, expands outwardly to push or press the circuit component packaging surfaces of the pipe-shaped circuit module 32.

Figure 15:
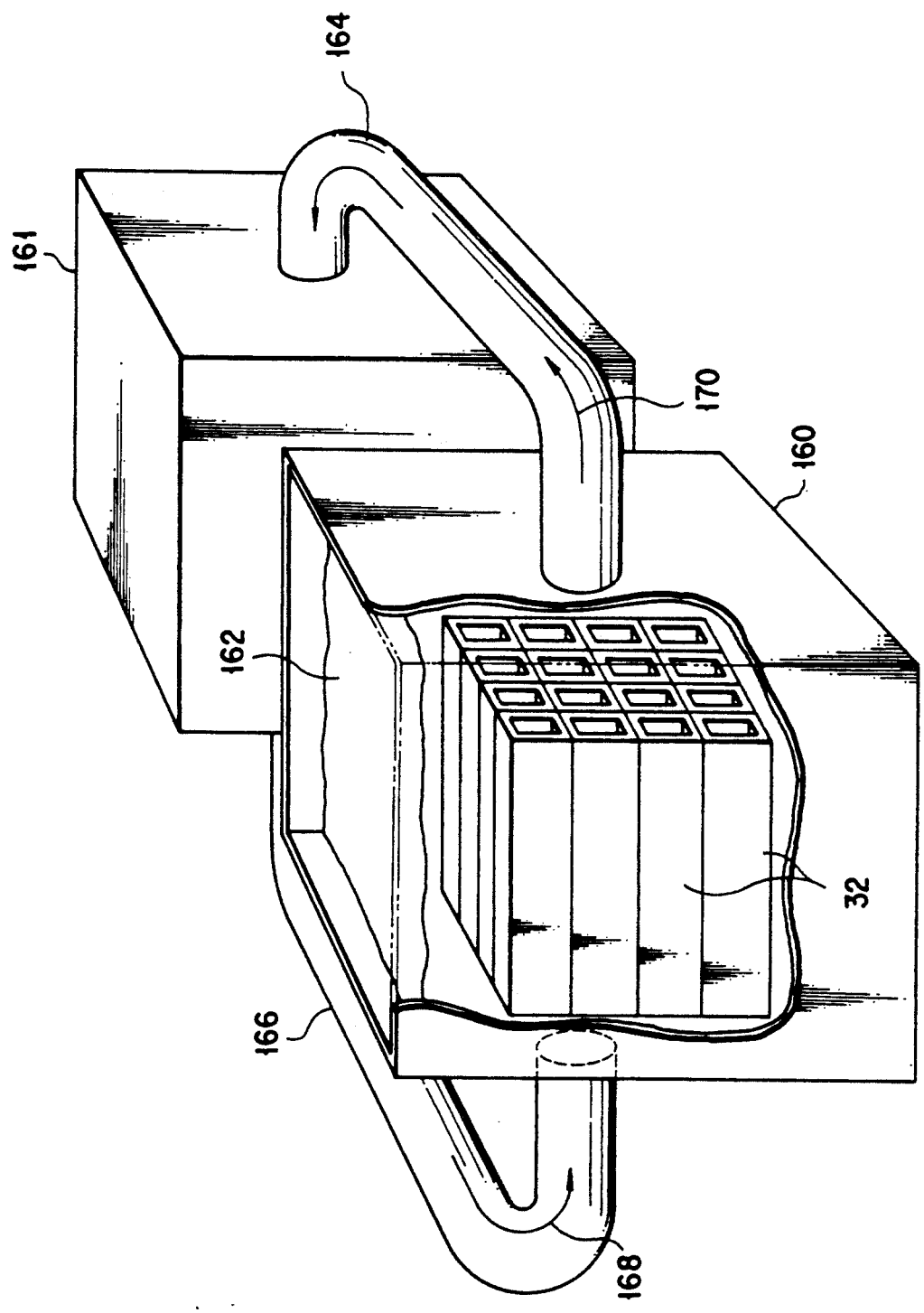
FIG. 15 is a perspective view of a system for cooling an assembly of rectangular pipe-shaped circuit modules.

According to an embodiment shown in FIG. 15, the circuit board packaging hardware structure 30 having the pipe-shaped circuit modules 32 bundled together as shown in FIG. 1 is entirely immersed in a liquid cooling tank 160, which stores cooling water 162 therein. The bundled circuit modules 32 are placed in the cooling water 162. The tank 160 is connected with a refrigerator 161 by coolant feed/return pipes 164,166. In the figure, arrows 168, 170 indicate horizontal flow of the cooling water. Naturally, insulating liquid is used as the coolant.

With such an arrangement, the cooling capability will be further improved. In addition, the bundle of pipe-shaped circuit modules 32 being totally immersed in the cooling liquid 162 can remain uniform as a whole in the application of physical stress between the circuit modules 32 due to the presence of the buoyancy of the cooling liquid. This will prevent lower pipe-shaped circuit modules from becoming deformed by the weight of upper circuit modules. Thus, the totally immersed feature will also lead to an improvement in reliability of electrical connection between pipe-shaped circuit modules 32.

The circuit board packaging hardware structure 30 employing the pipe-shaped circuit modules 32 according to the present invention offers the extensibility to a three-dimensional stack of the pipe-shaped circuit modules. More specifically, with the embodiments described previously, the circuit modules 32 are merely arranged side by side, or two-dimensionally as typically shown in FIG. 1; however, each of the circuit modules 32 may be stacked with a similar pipe-shaped circuit module or modules in the direction of the module length.

Figure 16:
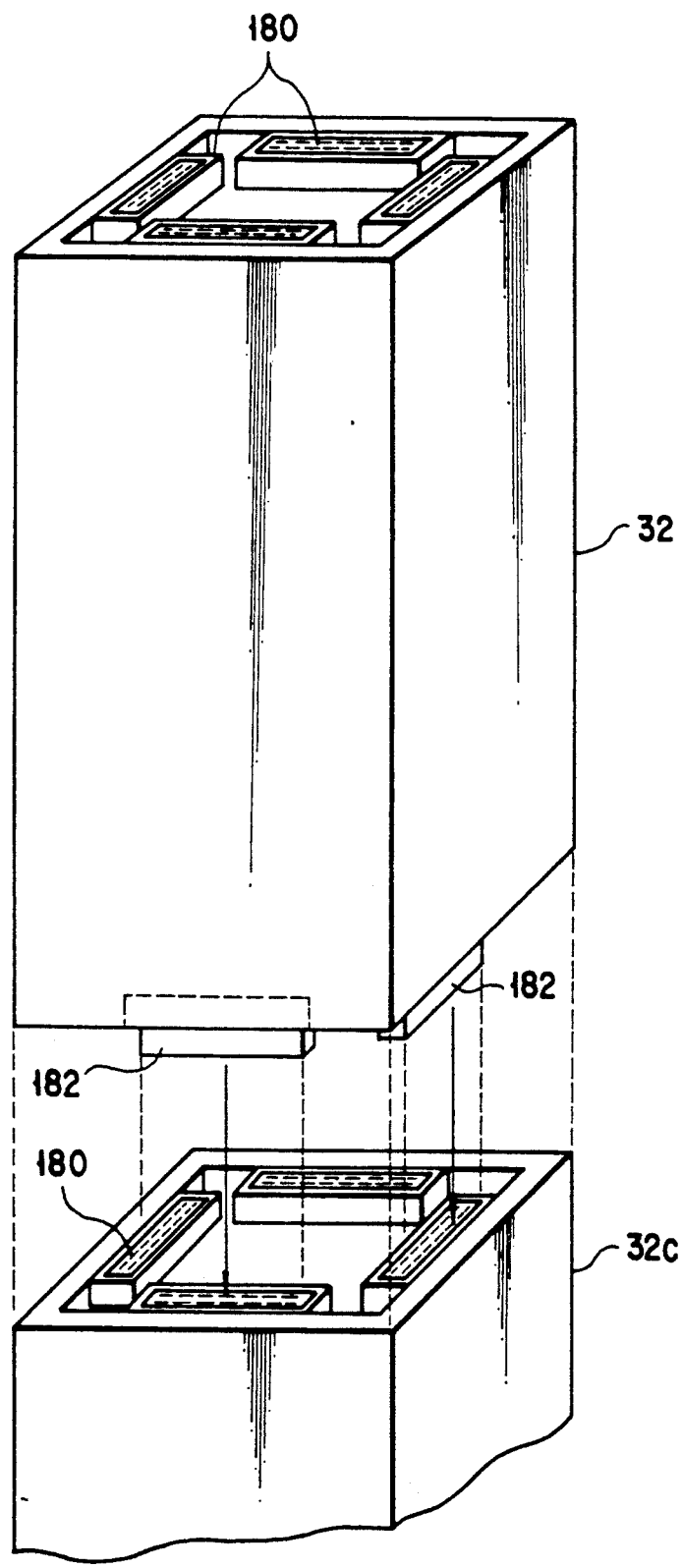
FIG. 16 is a fragmentary enlarged view in perspective of an embodiment in which rectangular pipe-shaped circuit modules are coupled together along their lengthwise dimension to thereby provide extensibility to a three-dimensional assembly.

In this case, the pipe-shaped circuit module 32, as shown in FIG. 16, is equipped with electrical connecting devices at its opening ends. At the upper opening end there are provided four female connectors 180 along the inner walls of a rectangular pipe 32. Correspondingly there are provided four male connectors 182 at the lower opening end. The male connectors 182 of the circuit module 32 are adapted to be fitted into female connectors 180 of another rectangular pipe-shaped circuit module 32c. The connectors 180, 182 of each pipe-shaped circuit module 32 are electrically communicative with circuit components packaged in it.

Such "three-dimensional extensibility of pipe-shaped circuit modules" feature, in other words, a "block stacking" feature which can permit further improvements in packaging density and packaging efficiency of the circuit board packaging structure 30. This feature may also suggest the possibility of subdivision of each pipe-shaped circuit module 32 into some shortened submodules to be coupled in the direction of their axes. The "subdivision" possibility will lead to an improvement in the maintenance of the circuit modules 32 after assembly. This can be said because, in the event of a failure, only a failing part would have to be taken out of a circuit module for subsequent electrical repairs.

Figure 17:
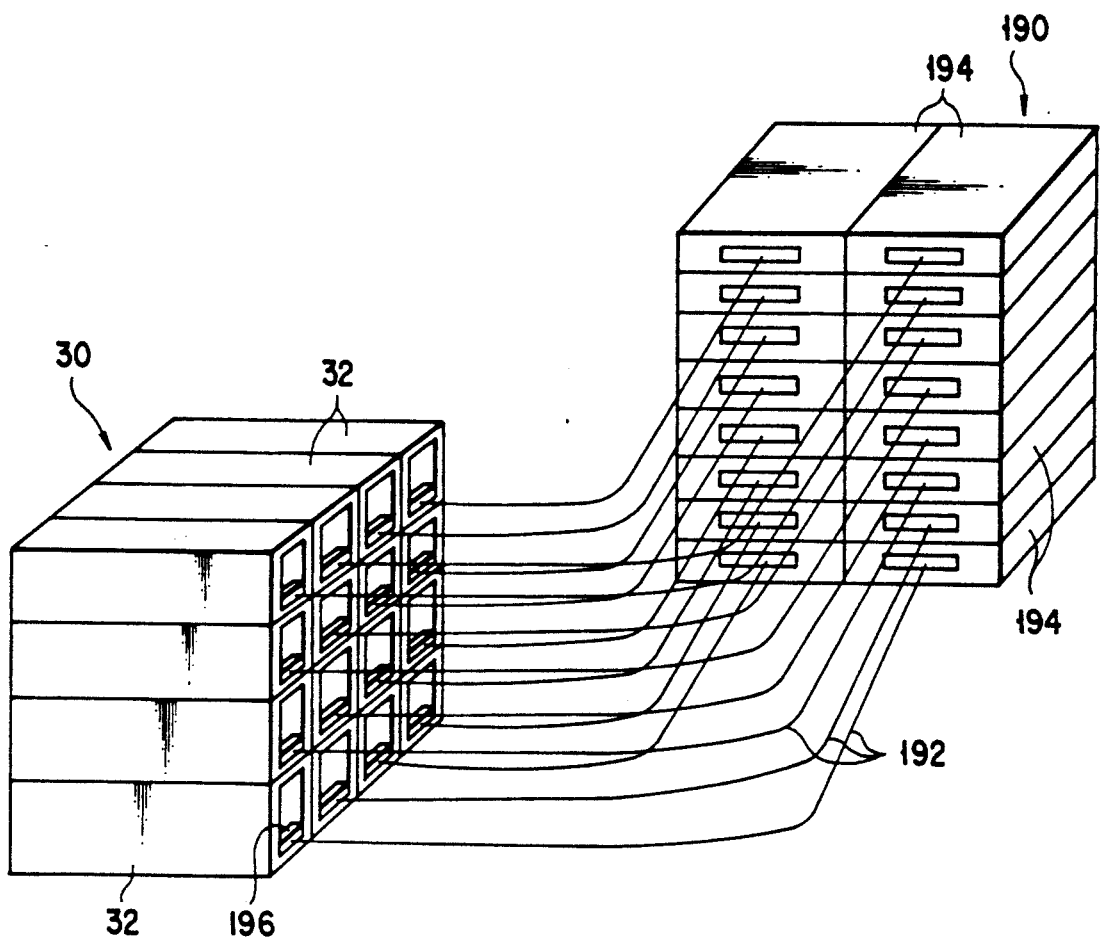
FIG. 17 illustrates a manner of connection between rectangular pipe-shaped circuit modules and external storage.

As shown in FIG. 17, the circuit board packaging hardware structure 30 having a number of rectangular pipe-shaped circuit modules 32 is coupled with an external storage apparatus 190 by cables 192. The external storage apparatus 190 includes magnetic disk units 194 that correspond in number to the circuit modules 32. The magnetic disk units 194 may be fixed-disk or hard-disk drive units 194. Assuming that the structure 30 is an assembly of sixteen (four by four) pipe-shaped circuit modules 32, the units 194 are stacked, for example, in two rows in the embodiment of FIG. 17. Signal input-/output transmissions between the circuit modules 32 and the hard-disk drive units 194 are carried out by the cables 192, which are stably coupled to the circuit modules 32 by cable connectors 196. The use of parallel cables 192 for establishing a one-to-one correspondence between the circuit modules 32 and the corresponding disk drive unit 194 improves or enhances the speed of signal transmissions between an increased number of pipe-shaped circuit modules 32 and their associated external storage units 194.

Figure 18:
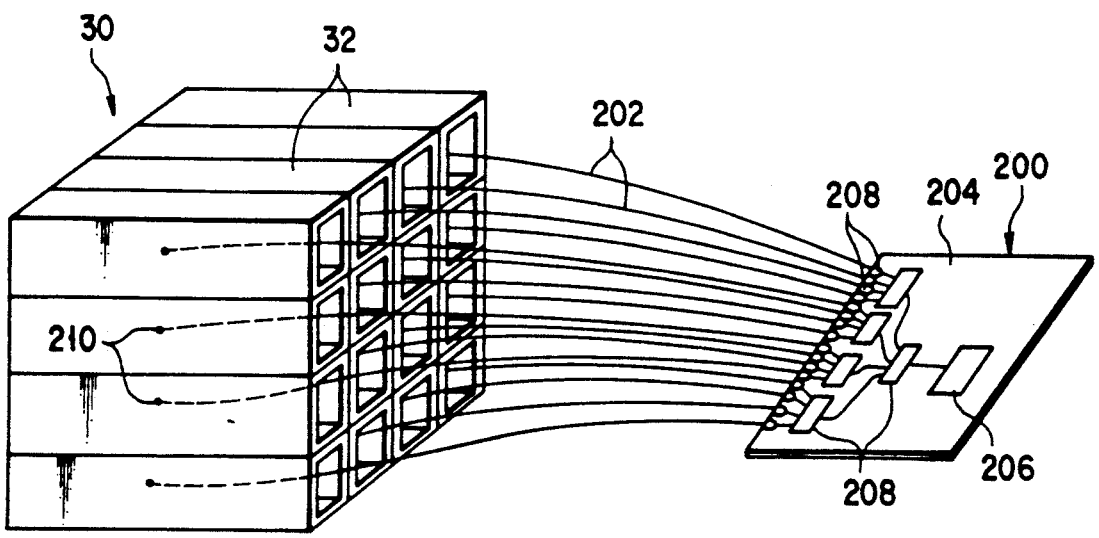
FIG. 18 illustrates a manner of connection between the rectangular pipe-shaped circuit modules of FIG. 17 and a common clock generator.

When the circuit board packaging structure 30 of FIG. 17 is connected to an external clock signal generator unit 200, the pipe-shaped circuit modules 32 are connected to the clock signal generator 200 by signal transmission cables 202 of equal length as shown in FIG. 18. The clock generator 200 has a printed wiring board 204 on which an existing semiconductor integrated circuit device 206 for generating a common clock signal is mounted. A selected number of driver IC devices 208 are connected to the IC 206 on the board 204. The board 204 has connecting pads corresponding in number to the circuit modules 32 along its edge. Each of the signal transmission cables 202 has a first end connected to a corresponding one of the connecting pads 208, and a second end connected to a connecting pad 210 provided in a selected position near the center of an inner wall surface of a corresponding one of the circuit modules 32. With such an arrangement, a common clock signal is distributed from the clock generator 200 to the circuit modules 32 through the cables 202 of equal length, making delays associated with clock signal transmission equal to one another. In addition, each of the clock transmission cables 202 runs inside a corresponding one of the circuit modules 32 to connect with the central connecting terminal, which prevents unwanted clock skew from occurring.

Figure 19:
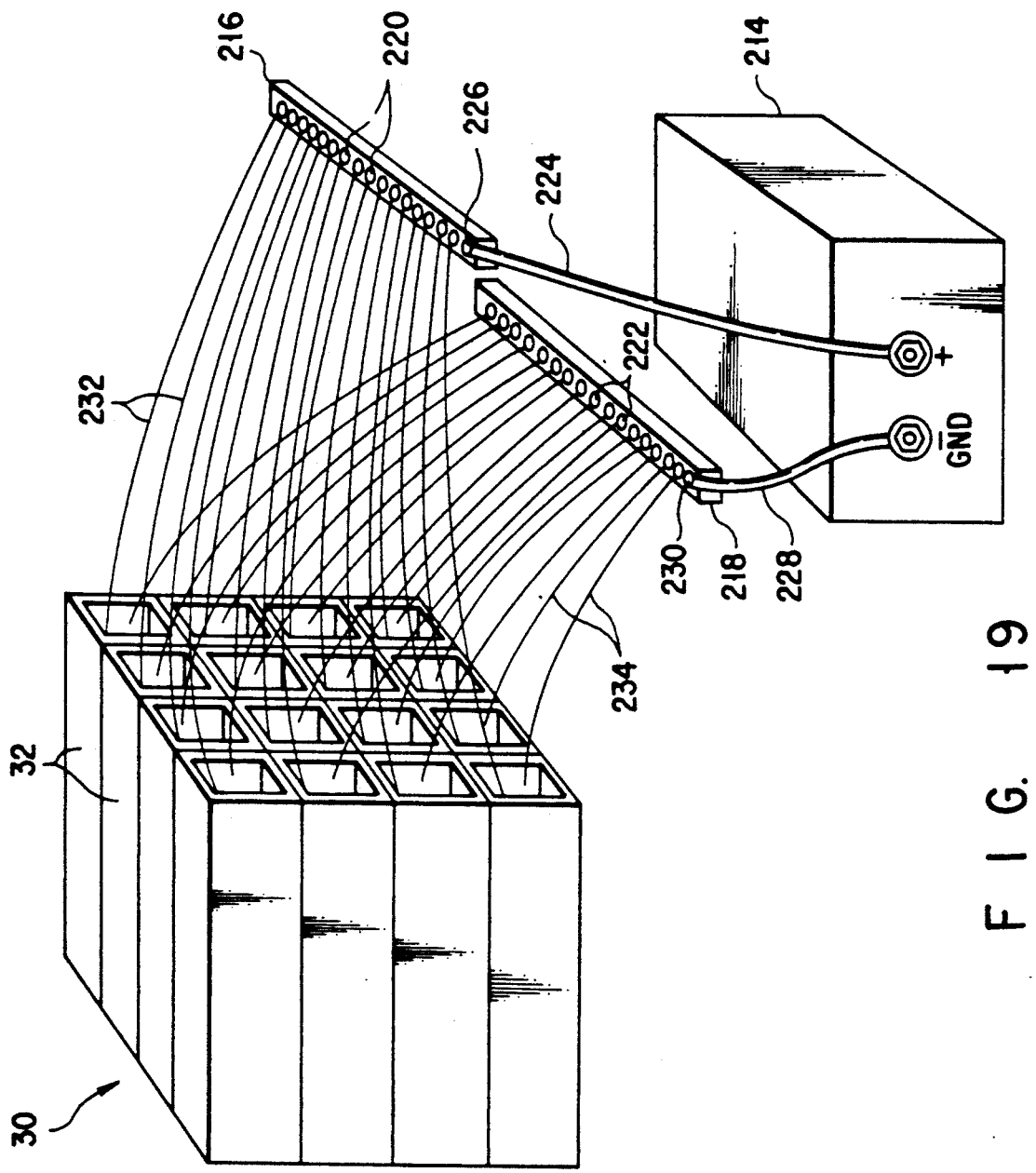
FIG. 19 illustrates a manner of connection between the rectangular pipe-shaped circuit modules of FIG. 17 and a power supply unit.

The circuit board packaging hardware structure 30 of FIG. 17 may be connected to a direct-current power supply unit 214 as shown in FIG. 19. The power supply unit 214 has a positive voltage output terminal and a ground potential terminal. Each of the pipe-shaped circuit modules 32 has a positive voltage input terminal and a ground terminal on the inner wall surfaces at its opening end. Electrical connection between corresponding terminals is effected with two bar-like intermediate connecting members 216,218, which have arrays of connection terminals 220,222. A first thick power cable 224 connects the positive terminal of the power supply unit with a common terminal 226 of the intermediate connecting member 216. A second thick power cable 228 connects the ground terminal of the power supply unit with a common terminal 230 of the other intermediate connecting member 218. A bundle of first thin cables 232 connects the terminals 220 of the intermediate connecting member 216 with the positive terminals of the circuit modules 32. A bundle of second thin cables 234 connects the terminals 222 of the intermediate connecting member 218 with the ground terminals of the circuit modules 32. Such a power supply system (independent of the signal transmission system) permits efficient power feeding. The power supply system can be applied to the above-described arrangement in which each of the circuit modules is subdivided.

Figure 20:
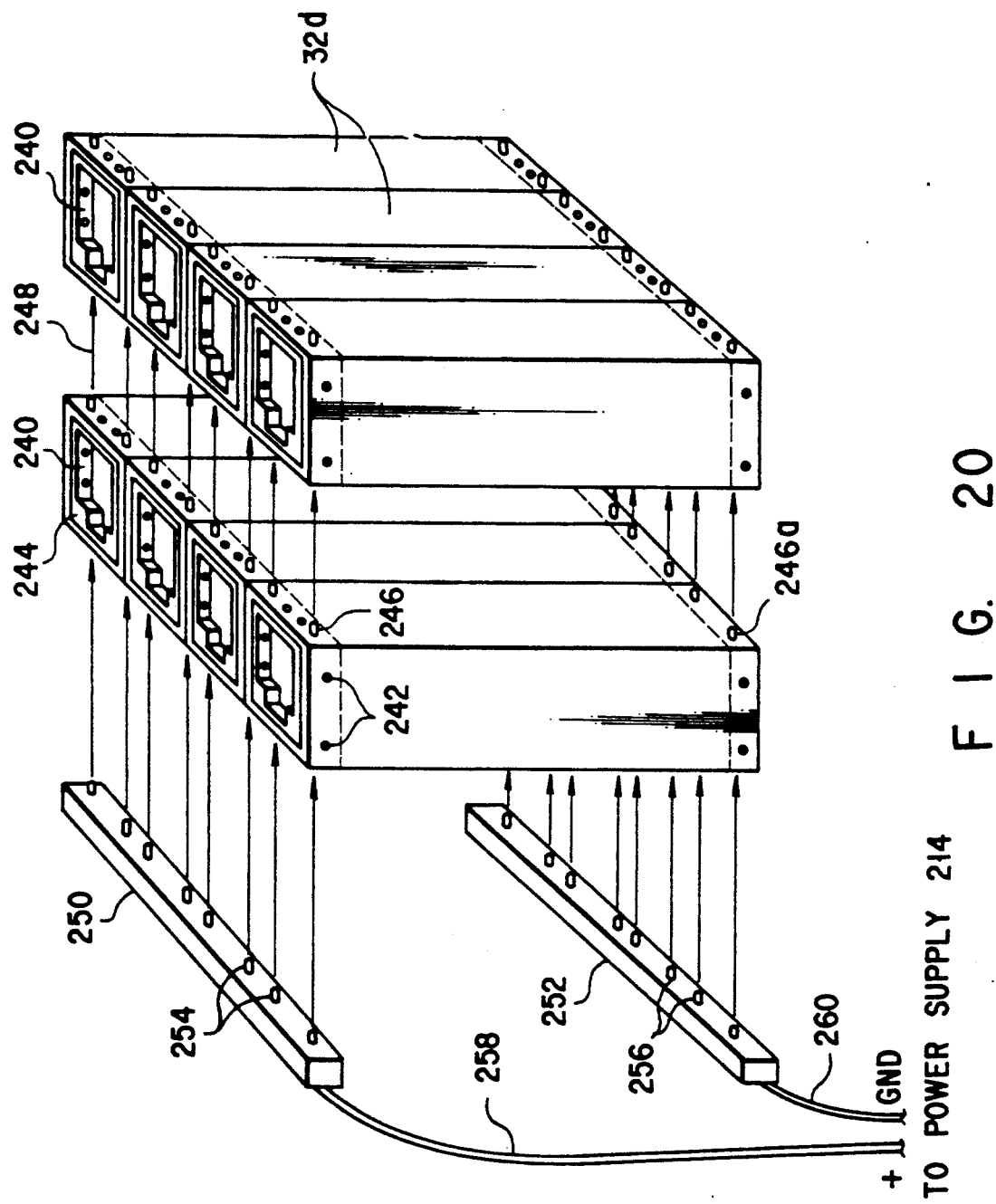
FIG. 20 illustrates a modified manner of connection between the rectangular pipe-shaped circuit modules and a power supply unit.

An embodiment shown in FIG. 20 provides a cable-less power supply system which saves the need of a large number of thin power cables 232,234 of FIG. 19. Each of the circuit modules 32 is equipped with connectors at its opposing opening ends. More specifically, reinforcing ring-like members 240, adapted to prevent the circuit modules from being deformed, are fixed to the inner walls of each circuit module at its both ends by means of screws 242. Each of the ring-like members 240 has a protrusion 244 in each of its two corners. Each circuit module has two connecting pins 246 in one of the two opposite outer wall portions at its opening end. Each circuit module has two similar connecting pins 246a in a corresponding outer wall portion at its other opening end. Each circuit module has conductive holes (not visible in FIG. 20) in the other of the two opposite outer wall portions at its upper and lower opening ends, into which the pins 246,246a are fitted. By fitting the pins 246,246a into the holes properly as indicated by arrows 248, the pipe-shaped circuit modules 32d are mechanically bundled together and electrical power supply paths therebetween are completed.

As shown in FIG. 20, elongated power sockets 250, 252 having connecting pins 254,256 are plugged into two arrays of power-feeding conductive holes of the outermost pipe-shaped circuit modules 32d. The socket 250 is connected to the positive terminal of the power supply unit 214 of FIG. 19 by a cable 258. The other socket 252 is connected to the ground terminal of the power supply unit 214 by a cable 260. Such a cordless power-feeding arrangement permits the power supply path configuration to be simplified with good mechanical coupling among the pipe-shaped circuit modules 32 maintained. This will lead to a further improvement in the high-density packaging efficiency.

The present invention is not limited to the above-described specific embodiments and may be practiced or embodied in still other ways without departing from the spirit or essential character thereof.

What is claimed is:

1. A circuit board packaging structure comprising:
a plurality of pipe-shaped circuit units each of which has two opposite first and second openings, an inner surface which permits electric circuit components to be mounted thereon and has wiring patterns for providing electrical interconnection therebetween, and an outer surface; and
connecting means provided on the outer surface of said pipe-shaped circuit units and electrically connected to said wiring patterns, for permitting each of said pipe-shaped circuit units to be coupled together in rows and columns and electrically interconnected to a corresponding one of said pipe-shaped circuit units associated therewith by area-contact on the outer surface thereof.

2. The structure according to claim 1, wherein said connecting means includes connecting terminals provided on said outer surface of said pipe-shaped circuit units.

3. The structure according to claim 2, wherein each of said pipe-shaped circuit units includes:
   four separate insulative substrates combined to define a hollow, rectangular pipe; and
   connector means for electrically connecting adjacent ones of said substrates.

4. The structure according to claim 2, wherein each of said pipe-shaped circuit units includes an insulative substrate processed to define a hollow, rectangular pipe.

5. The structure according to claim 2, wherein each of said pipe-shaped circuit units includes an insulative substrate bent to define a hollow, rectangular pipe.

6. The structure according to claim 2, wherein the connecting means further comprising:
   unidirectional connector means arranged between outer surfaces of adjacent ones of said pipe-shaped circuit units.

7. The structure according to claim 6, wherein said unidirectional connecting means includes an anisotropic conductive sheet.

8. The structure according to claim 2, further comprising:
   air-cooling means for causing cooling gas to flow through said pipe-shaped circuit units from their first openings to their second openings.

9. The structure according to claim 2, further comprising:
   liquid-cooling means for causing cooling liquid to flow through said pipe-shaped circuit units from their first openings to their second openings.

10. The structure according to claim 9, wherein said liquid-cooling means includes an elastic bag member incorporated into each of said pipe-shaped circuit units and having input/output openings for a cooling liquid, said bag member being expandable when pressurized by the cooling liquid.

11. The structure according to claim 9, wherein said liquid-cooling means includes:
   tank means for permitting said pipe-shaped circuit units to be supported stably therein and to be entirely immersed in the cooling liquid stored therein; and
   means associated with said tank means for forcing said cooling liquid to flow within said tank means in one direction.

12. The structure according to claim 2, further comprising:
   coupling means, provided for at least one of said pipe-shaped circuit units, for permitting said one of said pipe-shaped circuit units to be coupled with a similar circuit unit electrically and mechanically in the direction of their axes.

13. An electrical wiring assembly for use in a large-scale electronic equipment comprising:
   an array of rows and columns of rectangular pipe-shaped circuit modules, each of said circuit modules having opposing openings at its both ends, inner wall surfaces on which wiring patterns are defined so that electric circuit components are mounted thereon, and outer wall surfaces provided with external connecting terminals;
   clamping means for clamping said rectangular pipe-shaped circuit modules so as to join adjacent ones of said circuit modules so that said modules are in area-contact with one another on heir outer wall surfaces;
   connecting means, arranged between adjacent ones of said rectangular pipe-shaped circuit modules, for electrically connecting corresponding ones of said external terminals; and
   cooling means for causing a cooling medium to flow through said rectangular pipe-shaped circuit modules in a direction parallel with a axis of said modules to suppress or prohibit heat accumulation.

14. The assembly according to claim 13, wherein said connecting means includes an elastic, anisotropic conductive sheet.

15. The assembly according to claim 13, wherein each of said circuit modules comprises a plurality of rectangular pipe-shaped circuit submodules which are coupled together in a communicative manner along an axis direction thereof.

16. The assembly according to claim 13, further comprising:
   signal transmission lines which correspond in number to said circuit modules and are substantially equivalent in length to one another, each of said lines having a first end partially extending inside a corresponding one of said circuit modules and a second end connected to an external common clock signal generator.

17. The assembly according to claim 13, wherein said electrical circuit components include semiconductor integrated circuit devices.

* * * * *

UNITED STATES PATENT AND TRADEMARK OFFICE
CERTIFICATE OF CORRECTION

PATENT NO. : 5,329,418
DATED : July 12, 1994
INVENTOR(S) : Noboru TANABE

It is certified that error appears in the above-indentified patent and that said Letters Patent is hereby corrected as shown below:

On the title page, Item [75], the inventor's first name should read as follows:

--Noboru--

Signed and Sealed this

Twenty-seventh Day of September, 1994

Attest:

BRUCE LEHMAN

*Attesting Officer*              *Commissioner of Patents and Trademarks*